US010403357B2

(12) United States Patent
Roy et al.

(10) Patent No.: US 10,403,357 B2
(45) Date of Patent: Sep. 3, 2019

(54) RESISTIVE NON-VOLATILE MEMORY AND A METHOD FOR SENSING A MEMORY CELL IN A RESISTIVE NON-VOLATILE MEMORY

(71) Applicant: NXP USA, INC., Austin, TX (US)

(72) Inventors: Anirban Roy, Austin, TX (US); Perry Pelley, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/707,350

(22) Filed: Sep. 18, 2017

(65) Prior Publication Data

US 2019/0088317 A1    Mar. 21, 2019

(51) Int. Cl.
  *G11C 7/00* (2006.01)
  *G11C 13/00* (2006.01)
  *G11C 11/16* (2006.01)

(52) U.S. Cl.
  CPC ........ *G11C 13/004* (2013.01); *G11C 11/1655* (2013.01); *G11C 11/1673* (2013.01); *G11C 13/0026* (2013.01); *G11C 13/0028* (2013.01); *G11C 2013/0057* (2013.01); *G11C 2213/82* (2013.01)

(58) Field of Classification Search
  CPC .............. G11C 13/004; G11C 13/0026; G11C 13/0028
  USPC .................................................. 365/148, 205
  See application file for complete search history.

(56) References Cited

U.S. PATENT DOCUMENTS

| 5,856,945 | A | 1/1999 | Lee et al. | |
| 6,449,188 | B1 | 9/2002 | Fastow | |
| 6,492,844 | B2 | 12/2002 | Terzioglu et al. | |
| 6,868,025 | B2 | 3/2005 | Hsu | |
| 7,085,184 | B1 | 8/2006 | Walther et al. | |
| 7,573,748 | B2 | 8/2009 | Bedarida et al. | |
| 7,920,397 | B1 * | 4/2011 | Nataraj | G11C 7/12 365/49.1 |
| 8,514,630 | B2 * | 8/2013 | Huynh | G11C 29/02 365/185.21 |
| 8,730,722 | B2 * | 5/2014 | Koh | G11C 11/5628 365/185.03 |
| 8,872,578 | B1 * | 10/2014 | Pelley | H03K 19/017509 327/108 |
| 9,035,629 | B2 | 5/2015 | Ramaraju | |
| 9,164,526 | B2 * | 10/2015 | Pan | G11C 5/145 |

(Continued)

FOREIGN PATENT DOCUMENTS

WO    2016068992 A1    5/2016
WO    2016076879 A1    5/2016

*Primary Examiner* — Viet Q Nguyen

(57) ABSTRACT

An integrated circuit includes an array of resistive non-volatile memory cells having a plurality of word lines, a plurality of bit lines, and a plurality of source lines. The integrated circuit includes a sense amplifier coupled to a first bit line of the plurality of bit lines and a corresponding first source line of the plurality of source lines. When a memory cell coupled to the first bit line is selected for a read operation, the sense amplifier is configured to, during a calibration phase of the read operation, store a first voltage representative of a leakage current on the first source line. The sense amplifier is also configured to, during a sense phase of the read operation, apply the stored first voltage to the first bit line and provide a first sense amplifier output indicative of a logic state of the selected memory cell.

20 Claims, 5 Drawing Sheets

(56) References Cited

U.S. PATENT DOCUMENTS

| | | | | |
|---|---|---|---|---|
| 9,520,173 | B1* | 12/2016 | Baker, Jr. | G11C 11/1675 |
| 9,530,501 | B2* | 12/2016 | Pelley | G11C 8/16 |
| 9,640,256 | B1* | 5/2017 | Roy | G11C 14/0081 |
| 9,659,623 | B1* | 5/2017 | Sadd | G11C 11/1673 |
| 9,678,676 | B2* | 6/2017 | Nguyen | G06F 3/0616 |
| 9,698,676 | B1* | 7/2017 | Huynh | H02M 3/07 |
| 9,767,875 | B2* | 9/2017 | Roy | G11C 11/1673 |
| 9,777,537 | B1* | 10/2017 | Sani | B24D 3/06 |
| 9,779,795 | B1* | 10/2017 | Sadd | G11C 11/1673 |
| 9,810,723 | B2* | 11/2017 | Pan | G11C 29/025 |
| 9,847,127 | B1* | 12/2017 | Roy | G11C 13/0026 |
| 9,935,616 | B2* | 4/2018 | Sadd | H03J 5/02 |
| 10,032,524 | B2* | 7/2018 | Sabde | G11C 29/50 |
| 10,101,763 | B2* | 10/2018 | Tzafrir | G06F 13/1668 |
| 10,224,094 | B1* | 3/2019 | Pelley | G11C 11/1673 |
| 2004/0033793 | A1* | 2/2004 | Gauthier | H03L 7/0893 |
| | | | | 455/180.3 |
| 2005/0078536 | A1* | 4/2005 | Perner | G11C 7/02 |
| | | | | 365/209 |
| 2011/0241732 | A1* | 10/2011 | Tourret | G01R 19/04 |
| | | | | 327/58 |
| 2012/0008410 | A1* | 1/2012 | Huynh | G11C 29/02 |
| | | | | 365/185.21 |
| 2015/0187393 | A1 | 7/2015 | Ueda et al. | |
| 2016/0064092 | A1* | 3/2016 | Roy | G11C 16/26 |
| | | | | 365/185.22 |
| 2016/0148684 | A1 | 5/2016 | Lin et al. | |
| 2017/0316834 | A1* | 11/2017 | Huynh | G11C 29/025 |

\* cited by examiner

RESISTIVE NON-VOLATILE MEMORY AND A METHOD FOR SENSING A MEMORY CELL IN A RESISTIVE NON-VOLATILE MEMORY

BACKGROUND

Field

This disclosure relates generally to resistive non-volatile memories, and more specifically, to sensing a memory cell in a resistive non-volatile memory.

Related Art

Resistive memories are commonly used as non-volatile memories (NVMs). Reading data stored in such memories is accomplished by sensing differences in resistance in a resistive element of a memory cell between two states, a high resistive state (HRS) and a low resistive state (LRS). However, the difference in resistance between a high state and a low state can be very small, requiring a sense amplifier with high sensitivity. In many architectures, a bit line is shared among many different word lines, in which each word line controls a select transistor coupled to the bit line. Unselected select transistors along a bit line can be a source of leakage currents on the bit line. These leakage currents, which increase as temperature increases, can obscure the sensed bit line currents, especially in low power applications, making it even more difficult to differentiate between the two states of each bit cell. Therefore, a need exists for an improved sensing scheme for a resistive NVM.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In a resistive memory, a sensing scheme is implemented which takes into consideration the leakage current on the bit line in order to achieve more accurate sensing. A memory array includes word lines which intersect bit lines and corresponding source lines which run parallel to the bit lines. In one embodiment, a read operation of a selected bit cell includes both a calibration phase and a sense phase, in which the selected cell is coupled to a selected word line, a selected bit line, and a corresponding source line. During the calibration phase, the leakage current is determined for the column in memory containing the selected bit cell and a voltage representative of the leakage current is stored. During the subsequent sense phase of the read operation, the voltage representative of the leakage current is applied to compensation for the leakage current during the read operation. In this manner, improved sensing may be achieved, even as leakage currents increase, such as due to temperature increases.

Figure 1:
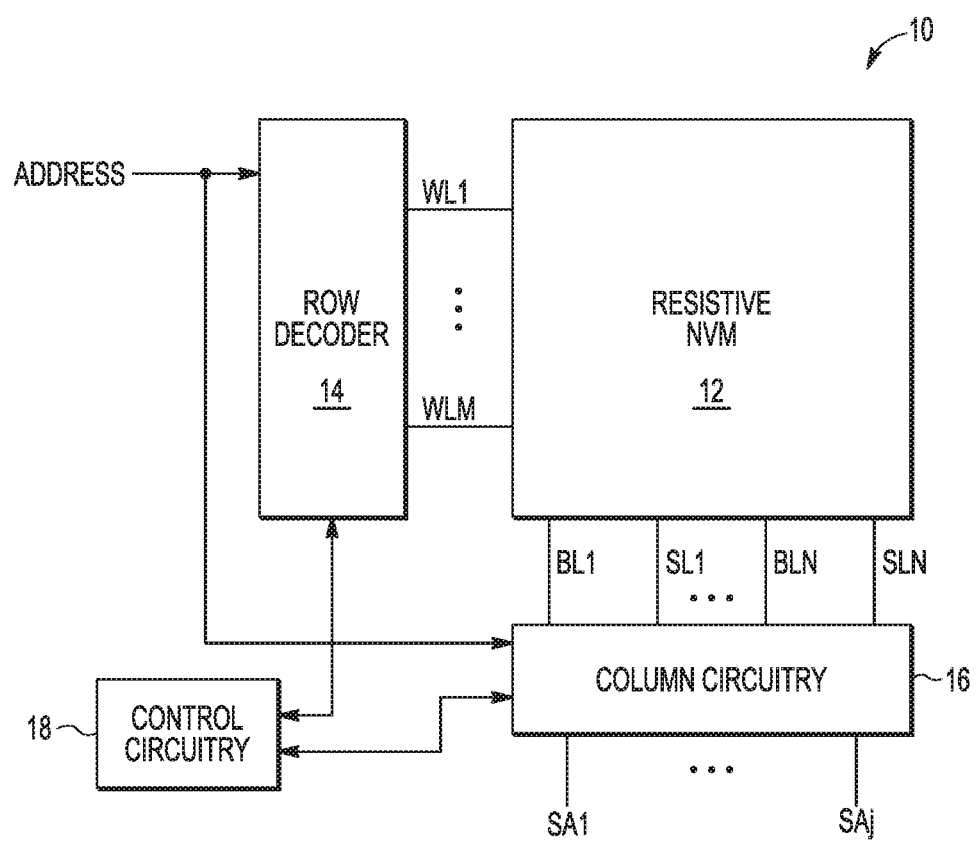
FIG. 1 illustrates, in block diagram form, a memory in accordance with one embodiment of the present invention.

FIG. 1 illustrates a memory 10 in accordance with one embodiment of the present invention. Memory 10 is formed in one or more integrated circuits. Memory 10 includes a resistive NVM array 12, a row decoder 14, column circuitry 16, and control circuitry 18. Array 12 includes M word lines, WL1-WLM, N bit lines, BL1-BLN, and N source lines, SL1-SLN. Row decoder 14 is coupled to the M word lines, and column circuitry 16 is coupled to the N bit lines and N source lines. Control circuitry 18 is coupled to row decoder 14 and column circuitry 16. An access address for a read or write access is provided to row decoder 14 and to column circuitry 16. In response to a read request, row decoder 14 asserts the selected word line based on a first portion of the access address, and column circuitry 16 accesses the selected bit lines and corresponding source lines based on a second portion of the access address, and column circuitry 16 outputs j sense amplifier outputs, SA1-SAj. Control circuitry 18 provides the appropriate control signals, as needed, to row decoder 14 and columns circuitry 16 to perform read and write operations, and also provides the appropriate control signals to the switches in column circuitry 16. Note that FIG. 1 is not a complete diagram with all elements of memory 10. Only those elements needed to understand the described embodiments are included. For example, data signals and other control signals can be received by memory 10 and other circuitry may be included in addition to the row decoder, column circuitry, and control circuitry. However, the embodiments described herein relate to read operations of memory 10, therefore, circuitry related to a write operation will not be discussed herein.

Figure 2:
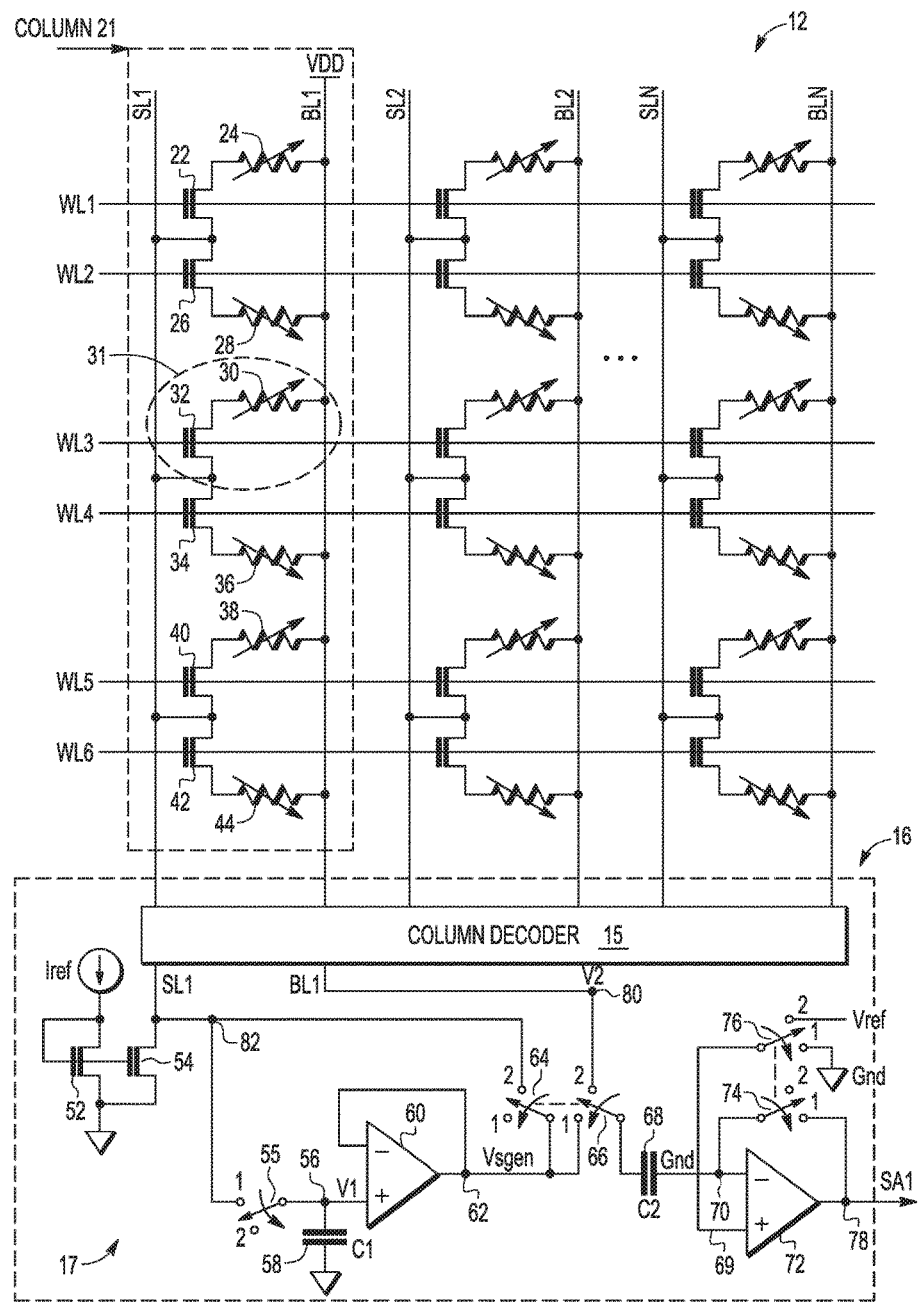
FIG. 2 illustrates, in schematic form, a more detailed view of the memory array and column circuitry of FIG. 1, in accordance with one embodiment of the present invention.

FIG. 2 illustrates a more detailed view of memory array 12 and column circuitry 16. At the intersection of each word line and bit line is a resistive memory cell. Each bit line also has a corresponding source line parallel to the bit line. Therefore, each column of array 12 includes a bit line and source line which are intersected by the M word lines. Each resistive memory cell includes a resistive element and a select transistor, and is coupled to a corresponding bit line, word line, and source line. Note that a source line is shared by all memory cells along a column. For example, column 21 includes M memory cells, in which each memory cell is coupled to both BL1 and SL1, and coupled to a word line of WL1-WLM. A first memory cell in column 21 includes a select transistor 22 and a resistive element 24. A first current electrode of transistor 22 is coupled to SL1, a control electrode is coupled to a corresponding word line, WL1, and a second current electrode is coupled to a first terminal of resistive element 24. A second terminal of resistive element 24 is coupled to a corresponding bit line, BL1. A second memory cell in column 21, immediately below the first memory cell, includes a select transistor 26 and a resistive element 28. A first current electrode of transistor 26 is coupled to SL1, a control electrode is coupled to a corresponding word line, WL2, and a second current electrode is coupled to a first terminal of resistive element 28. A second terminal of resistive element 28 is coupled to a corresponding bit line, BL1. A third memory cell in column 21 includes a select transistor 32 and a resistive element 30 coupled in a similar manner to SL1 and BL1 and a corresponding word line, WL3, and a fourth memory cell in column 21 includes a select transistor 34 and a resistive element 36 coupled in a similar manner to SL1 and BL1 and a corresponding word line, WL4. Therefore, each select transistor along column 21 has a first current electrode coupled to SL1 and a second current electrode coupled to a first terminal of a corresponding resistive element, in which the corresponding resistive element has a second terminal coupled to BL1.

In the illustrated example, a particular bit cell is selected for reading by asserting or activating the corresponding word line (placing the corresponding word line to VDD), in which the source lines and non-selected word lines, are all at VSS (e.g., ground). For example, to select cell 31 for reading, WL3 is activated such that a current flows through select transistor 32 and resistive element 30 onto BL1, The current is sensed to determine the logic state of the memory cell.

Column circuitry 16, coupled to array 12, includes column decoder circuitry 15 and j sense amplifiers at the output of column decoder 15. Column decoder 15 is coupled to BL1-BLN and SL1-SLN and, based on the access address, couples j selected bit lines and corresponding source lines to the j sense amplifiers. For example, with an access address, a group of bit lines, such as BL0-BL3, may be selected, and Y-decoder, based on a portion of the access address, couples one of BL0-BL3 to one of the j sense amplifiers. The j sense amplifiers output SA0-SAj, respectively.

FIG. 2 illustrates the details of a sense amplifier 17 which outputs SA1. In the example of FIG. 2, it is assumed that BL1 and SL1 are selected by column decoder 15 and coupled to sense amplifier 17 via circuitry within decoder 15. However, depending on the access address, a different column (thus different source line and bit line) can be coupled to sense amplifier 17. However, for ease of explanation, the inputs to sense amplifier 17 from array 12 are assumed to be SL1 and BL1.

Sense amplifier 17 is one of the j sense amplifiers. The other j-1 sense amplifiers (the details of which are not shown in FIG. 2) include analogous circuitry to sense amplifier 17. Sense amplifier 17 includes n-type transistors 52 and 54, amplifiers 60 and 72, capacitors C1 58 and C2 68, and switches 55, 64, 66, 76, and 74. Transistor 52 has a first current electrode and a control electrode coupled to receive a reference current source. Iref, and a second current electrode coupled to ground. Transistor 54 has a first current electrode coupled to node 82 which is coupled to SL1, a control electrode coupled to the control electrode of transistor 52, and a second current electrode coupled to ground, Switch 55 has a first terminal coupled to a circuit node 82 which receives SL1 and a second terminal. In a first position corresponding to the first terminal, switch 55 couples SL1 to a circuit node 56 at the non-inverting input of amplifier 60, and in a second position corresponding to the second terminal, switch 55 decouples SL1 from node 56. A first terminal of C1 58 is coupled to node 56 and a second terminal is coupled to ground. A output of amplifier 60 is coupled to a circuit node 62 and provides the voltage, Vsgen, and an inverting input of amplifier 60 is coupled to node 62.

Switch 64 has a first terminal and a second terminal. In a first position corresponding to the first terminal, switch 64 decouples node 62 from node 82, and in a second position corresponding to the second terminal, switch 64 couples node 62 to node 82, and thus SL1. Switch 66 has a first terminal and a second terminal. In a first position corresponding to the first terminal, switch 66 couples circuit node 62 to a first terminal of C2 68, and in a second position corresponding to the second terminal couples a circuit node 80, which is coupled to BL1, to the first terminal of C2 68. In one embodiment, switches 64 and 66 are simultaneously controlled such that when switch 64 is in the first position, so is switch 66, and when switch 64 is in the second position, so is switch 66.

A second terminal of C2 68 is coupled to a circuit node 70 at an inverting input of amplifier 72. A circuit node 69 is at a non-inverting input of amplifier 72. A circuit node 78 is at an output of amplifier 72 which provides SA1, corresponding to the sensed logic state of the selected memory cell. Switch 76 has a first terminal and a second terminal. In a first position corresponding to the first terminal, switch 76 couples node 69 at the non-inverting input of amplifier 72 to a first reference voltage, such as, for example, ground, and in a second position corresponding to the second terminal, switch 76 couples a second reference voltage, Vref, to node 69. Switch 74 has a first terminal and a second terminal. In a first position corresponding to the first terminal, switch 74 couples node 70 at the inverting input of amplifier 72 to the output of amplifier 72, and in a second position corresponding to the second terminal, switch 74 decouples the output of amplifier 72 from node 70. In one embodiment, switches 76 and 74 are simultaneously controlled such that when switch 76 is in the first position, so is switch 74, and when switch 76 is in the second position, so is switch 74. Control circuitry 18 of FIG. 1 provides signals to each of switches 55, 64, 66, 74, and 76 to control their positions, as needed, during operation.

Figure 3:
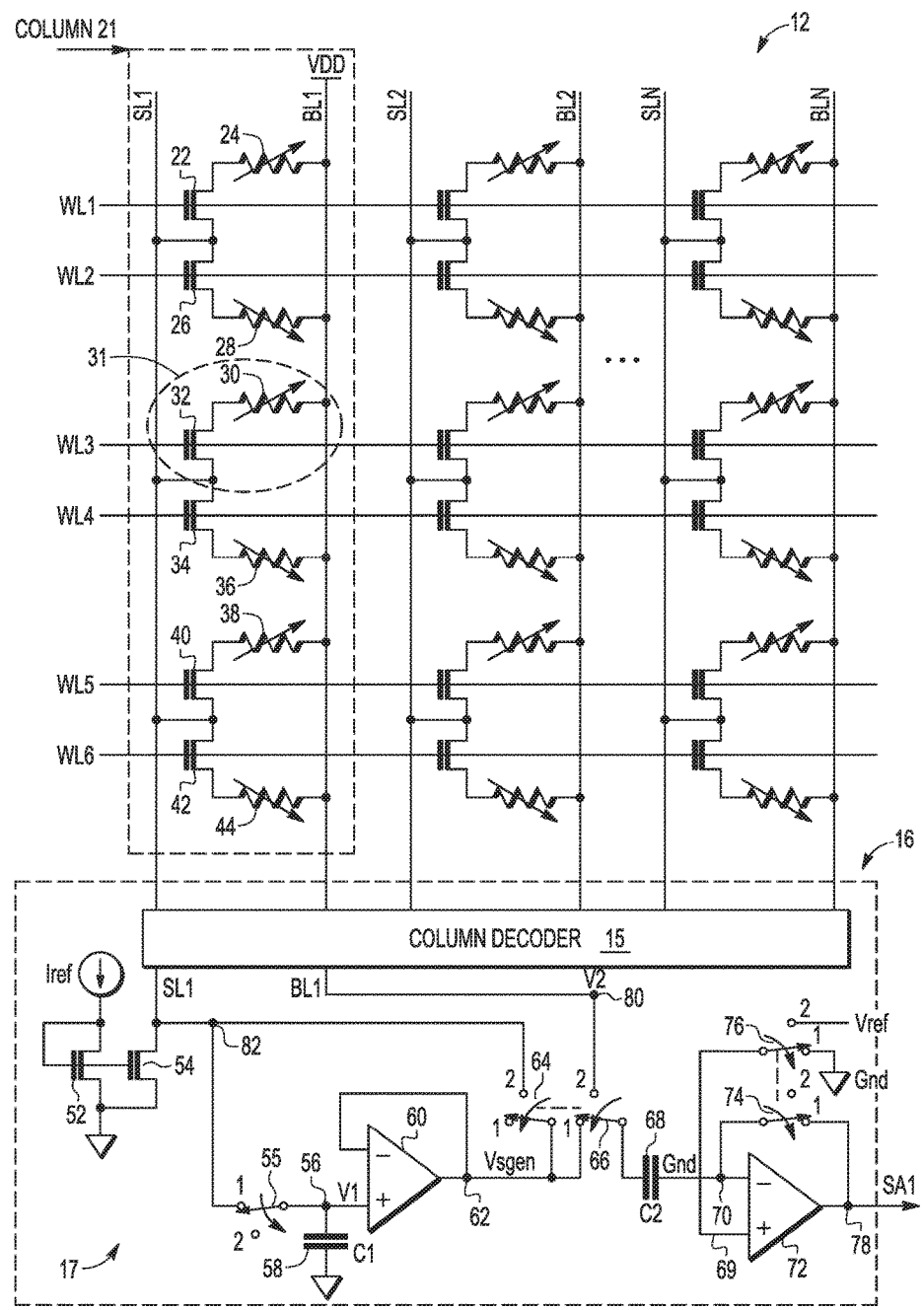
FIGS. 3-5 illustrate, in schematic form, the more detailed view of the memory array and column circuitry of FIG. 2, in various different configurations for a calibrate and a sense phase of a read operation, in accordance with embodiments of the present invention.
Figure 4:
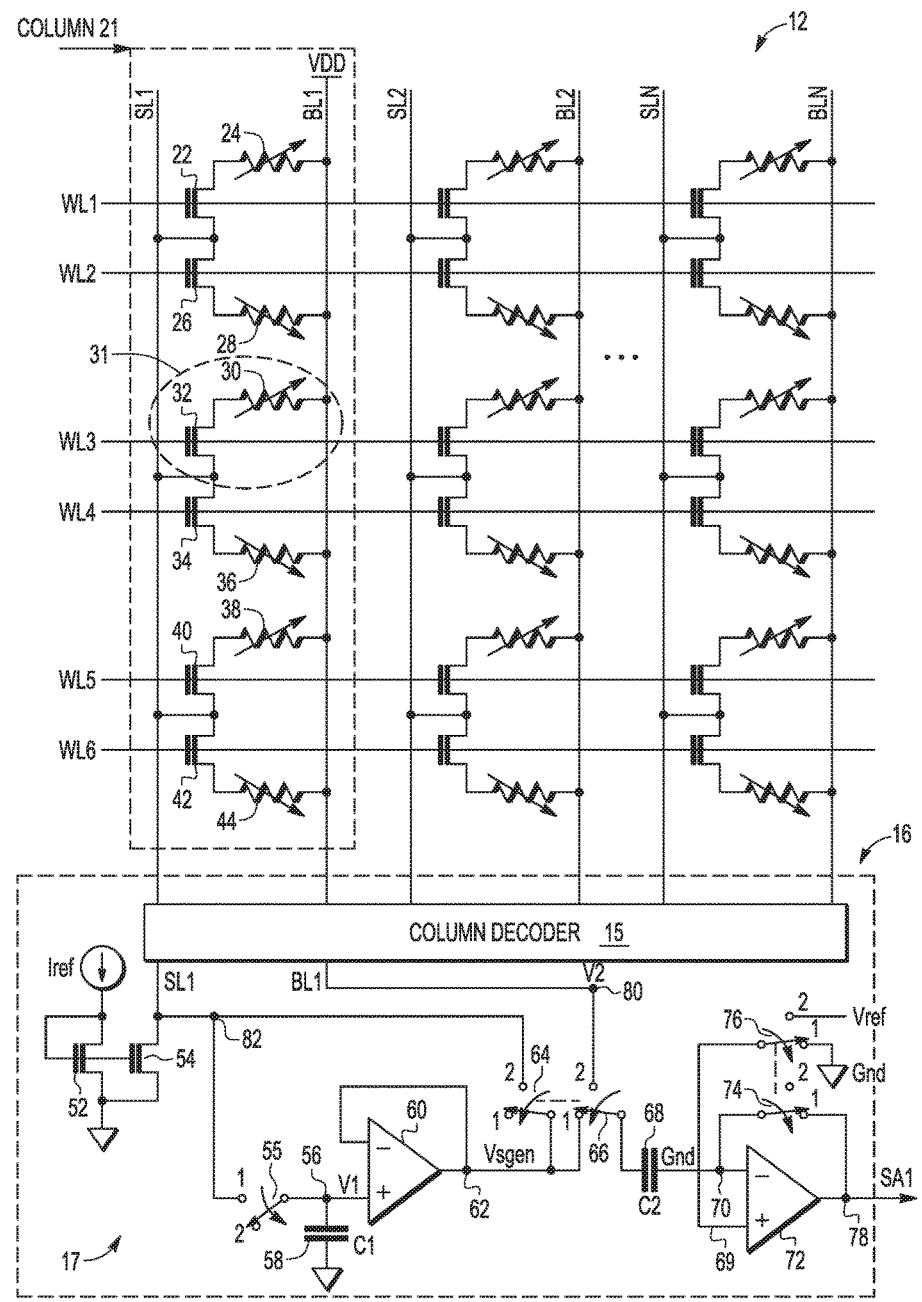
Figure 5:
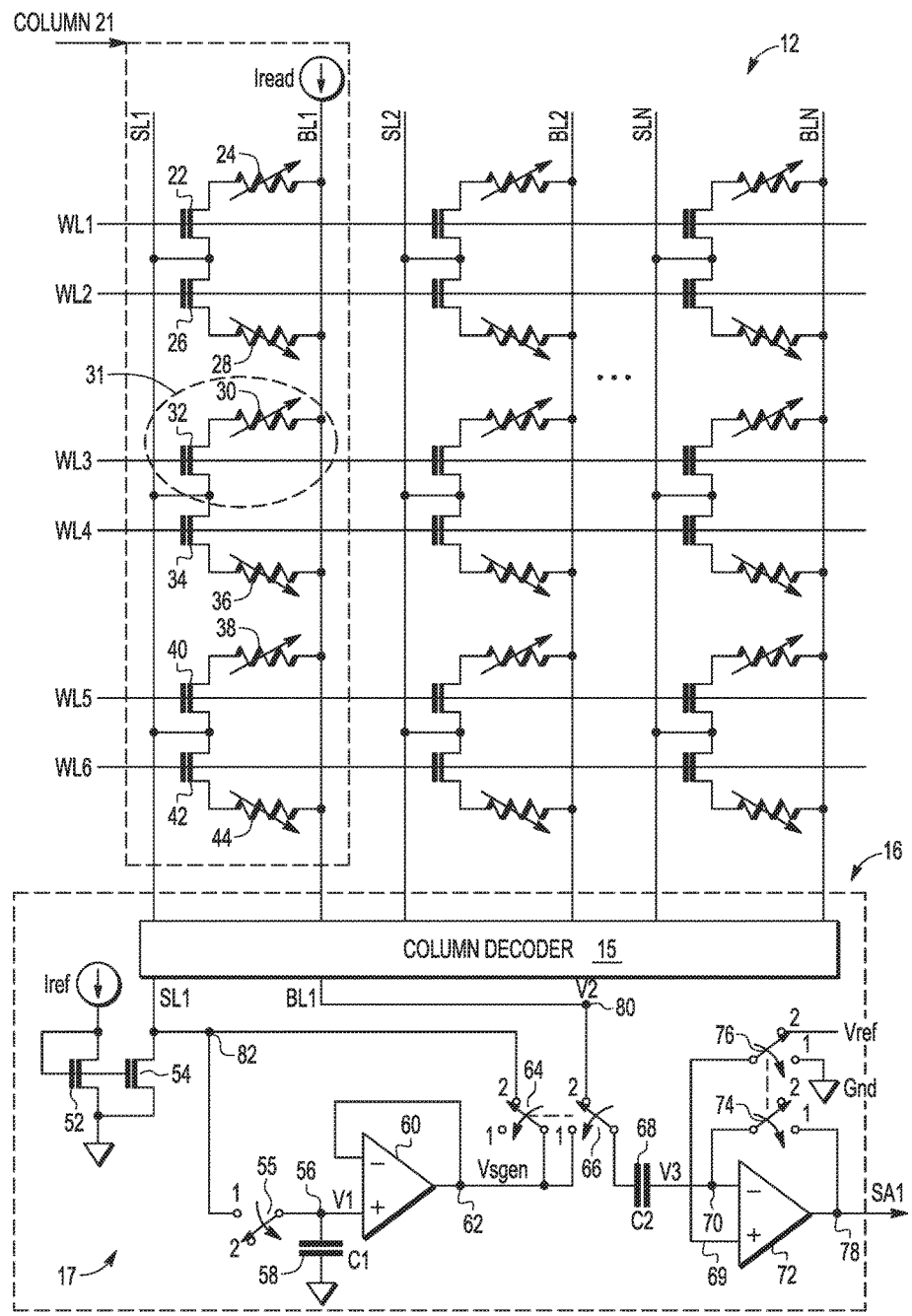

A read operation of array 12 includes a calibration phase followed by a sense phase. FIGS. 3 and 4 illustrate sense amplifier 17 with switch positions corresponding to the calibration phase of a read operation, and FIG. 5 illustrates sense amplifier 17 with switch positions corresponding to the sense phase of the read operation. Since SL1 (which runs parallel to BL1) is shared among all the cells of column 21, each select transistor in column 21 may contribute leakage current to BL1 from SL1. For example, leakage current from SL1 may be provided via unselected select transistor 22 and resistive element 24 to BL1. Similarly, leakage current may be provided via unselected select transistor 26 and resistive element 28 to BL1. Any unselected select transistor in column 21, coupled to SL1, can provide a leakage current to BL1, which can obscure the sensing current produced on BL1. Therefore, during the calibration phase, a voltage representative of the leakage current on the sensed bit line, BL1, is obtained.

Referring to FIG. 2, during a first portion of the calibration phase, switches 55, 64, 66, 74, and 76 are placed in their respective first positions. Also, during this first portion of the calibration phase, all the word lines are deselected and a precharge voltage, such as VDD, is supplied to the column bit line BL1. Note that known precharge circuitry may be used to apply the precharge voltage to BL1. Transistors 52 and 54 form a current mirror which sinks a predetermined maximum allowed leakage current ref from the column source line SL1. That is, transistors 52 and 54 limit the leakage current on SL1 to Iref. Since switch 55 couples SL1 to the first terminal of C1 58, the resulting source line voltage, V1, from SL1 is sampled onto C1 58. Amplifier 60 is configured as an offset compensated unity gain amplifier which is used to provide a low impedance source with a voltage, Vsgen, equal to the capacitor sampled voltage V1. Note that Vsgen therefore represents the leakage current on SL1. If there were no leakage current, Vsgen would be close to 0. Since the primary leakage on SL1 is the subthreshold leakage from the unselected select transistors, the leakage on SL1 is approximately equal to the leakage current on BL1. Therefore, Vsgen is representative of the leakage current on BL1.

Continuing with a second portion of the calibration phase, following the first portion, as illustrated in FIG. 4, switch 55 is placed into its second position to decouple the first terminal of C1 68 from SL1. This completes a sample and hold operation to obtain a voltage which represents the actual leakage current provided by SL1. At this point, Vsgen, is transferred onto the first terminal of C2 68 via switch 66. The second terminal of C2 68 is coupled to the inverting input of amplifier 72 which is configured as an offset compensated amplifier with a gain of Av. Due to switch 76, the non-inverting input of amplifier 72 is coupled to a first reference voltage, such as ground. Amplifier 72 is coupled into a unity gain configuration by switch 74, forcing the voltage across C2 capacitor 68 to be Vsgen. In this manner, Vsgen is captured and may be applied during a sense phase of the read to more accurately perform the read operation.

FIG. 5 illustrates sense amplifier 17 with switch positions corresponding to the sense phase of the read operation, which follows the calibration phase. In the illustrated embodiment, it is assumed that bit cell 31 is selected to be read, thus WL3 is activated (turning on select transistor 31) and the remaining word lines remain deactivated. In the sense phase, switches 64, 66, 74, and 76 are each switched to the second position. This couples Vsgen to SL1 (via switch 64) and the first terminal of C2 68 to BL1 (via switch 66). This causes the second terminal of capacitor C2 68 to be voltage V3 which is equal to BL1 minus Vsgen. Switch 76 couples Vref to the non-inverting input of amplifier 72 and switch 74 opens the feedback path around amplifier 72 such that SA1 is no longer feedback to the inverting input of amplifier 72. Vref may be generated by any one of the known methods to provide a voltage approximately equal to the average of the HRS and LRS. In some embodiments, Vref must be leakage compensated in a way similar to the method for compensating for leakage between SL1 and BL1.

A read current, Iread, is then applied to a first end of the bit line, BL1, in which the first end is at the opposite end of the bit line from sense amplifier 17. The voltage across C2 68 remains at Vsgen from the calibration phase. The bit line voltage of BL1 settles at V2 which equals "Vsgen+Vbit". Vsgen is the voltage due to the leakage current previously stored in C2 68, and Vbit is the voltage across resistive element 30 and select transistor 32 of selected bit cell 31. Therefore, the bit line voltage V2 is representative of only Vbit and the leakage current. The voltage V3 at the second terminal of C2 68 is "V2−Vsgen" which, through substitution, is equivalent to "(Vsgen+Vbit)−Vsgen". The output of amplifier 72, SA1, during the sense phase is "Av(Vref−V3)", which is equivalent to "Av(Vref−Vbit)". In this manner, by saving the value of the leakage current (corresponding to Vsgen) during the calibration phase, Vsgen can be applied during the sense phase to cancel the effects of the leakage current while sensing. This allows for improved sensing that is not obstructed by leakage current on BL1. Furthermore, note that Vsgen is representative of the actual leakage current along the bit line that is being sensed rather than an approximation that is obtained with a reference or other bit line that is not the bit line actually being sensed. This allows for improved accuracy in sensing. Also, since the leakage determined during the calibration phase is applied during the following sense phase in each read operation, accurate sensing can still be achieved even as temperature rises and causes an increase in leakage current.

Note that switch 55 may be referred to as a first switching circuit, switches 64 and 66 can be referred to as a second switching circuit, and switches 74 and 76 can be referred to as a third switching circuit, all of which are controlled with signals from control circuitry 18. Switches 64 and 66 may be controlled with the same signal such that they switch between the first and second positions at the same time, and switches 74 and 76 may be controlled with the same signal such that they switch between the first and second positions at the same time. Note also that different circuitry and logic can be used to implement the switching functions of these switches.

Therefore, by now it can be understood how a leakage current present on a shared bit line can be stored during a calibration phase of a read operation and then be applied during a subsequent sense phase of the same read operation in order to achieve increased sensing accuracy. In this manner, as leakage voltages vary, such as due to temperature variations, the logic states of memory cells can be accurately determined. Note that although the technique herein is described in reference to an MRAM memory cell, the technique can apply to any type of resistive element memory cell.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

In one embodiment, the illustrated elements of memory 10 are circuitry located on a single integrated circuit or within a same device. Memory 10 may be included in a larger integrated circuit with other circuitry, such as one or more processors, or may be packaged with in a system-on-chip (SoC) device.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, more or fewer amplification stages may be used in each sense amplifier. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes an array of resistive non-volatile memory cells comprising a plurality of word lines, a plurality of bit lines, and a plurality of source lines, wherein each non-volatile memory cell is coupled to a corresponding word line, a corresponding bit line, and a corresponding source line, and each source line corresponds to one bit line and is shared by all memory cells of a memory column coupled to the corresponding one bit line; a sense amplifier coupled to a first bit line of the plurality of bit lines and a corresponding first source line of the plurality of source lines, wherein the sense amplifier includes a first capacitor, a first switch configured to couple the first bit line to a first terminal of the first capacitor in a first position and configured to decouple the first bit line from the first terminal of the first capacitor in a second position, a first amplifier having a non-inverting input coupled to the first terminal of the first capacitor and an inverting input coupled to an output of the first amplifier, a second switch configured to decouple the output of the first amplifier from the first bit line in a first position and to couple the output of the first amplifier to the first bit line in a second position, a second capacitor; a third switch configured to couple the output of the first amplifier to a first terminal of the second capacitor in a first position and to couple the first bit line to the first terminal of the second capacitor in a second position; a second amplifier having an inverting input coupled to a second terminal of the second capacitor; and a fourth switch configured to couple an output of the second amplifier to the inverting input of the second amplifier in a first position and to decouple the output of the second amplifier from the inverting input of the second amplifier in a second position.

In one aspect of this embodiment, during a calibration phase of a read operation of a non-volatile memory cell coupled to the first bit line, the first, second, third, and fourth switches are in their respective first position. In a further aspect, during the calibration phase of the read operation, the first switch is changed to its second position, while the first, third, and fourth switches remain in their respective first positions. In another further aspect, after completion of the calibration phase, the second capacitor stores a voltage representative of a leakage current on the first source line. In yet a further aspect, during a sense phase of the read operation, subsequent to completion of the calibration phase, the second, third, and fourth switches are changed to their respective second positions and the output of the second amplifier provides a first output of the sense amplifier. In another further aspect, during the sense phase, the voltage representative of the leakage current on the first source line is applied to a first end of the first bit line closest to the sense amplifier while a read current is applied to a second end of the first bit line, opposite the first end. In another aspect of this embodiment, the integrated circuit further includes a column decoder coupled between the array and the sense amplifier and configured to select the first bit line from a first subset of bit lines of the plurality of bit lines. In a further aspect, the integrated circuit further includes a plurality of sense amplifiers coupled to the column decoder, wherein the column decoder is configured to select a selected bit line from a corresponding subset of bit lines from the plurality of bit lines and couple the selected bit line to a corresponding sense amplifier. In another aspect, the integrated circuit further includes a current mirror coupled to the first source line, wherein the current mirror is configured to, during the calibration phase, limit the leakage current on the first source line to a predetermined reference current. In yet another aspect, the sense amplifier further comprises a fifth switch configured to couple a first reference to the non-inverting input of the second amplifier in a first position and a second reference to the non-inverting input of the second amplifier in a second position.

In another embodiment, an integrated circuit includes an array of resistive non-volatile memory cells comprising a plurality of word lines, a plurality of bit lines, and a plurality of source lines, wherein each non-volatile memory cell is coupled to a corresponding word line, a corresponding bit line, and a corresponding source line, and each source line corresponds to one bit line and is shared by all memory cells of a memory column coupled to the corresponding one bit line; a sense amplifier coupled to a first bit line of the plurality of bit lines and a corresponding first source line of the plurality of source lines, wherein, when a memory cell coupled to the first bit line is selected for a read operation, the sense amplifier is configured to during a calibration phase of the read operation of the memory cell, store a first voltage representative of a leakage current on the first source line, and during a sense phase of the read operation, apply the stored first voltage to the first bit line and provide a first sense amplifier output indicative of a logic state of the selected memory cell. In one aspect of this another embodiment, the sense amplifier is configured to, during the sense phase of the read operation, apply a read current to a first end of the first bit line in which a second end of the first bit line, opposite the first end, is coupled to the stored first voltage. In another aspect, the sense amplifier comprises a first amplifier coupled to the first source line and configured to, during the calibration phase of the read operation, generate the first voltage and transfer the first voltage to a first capacitive element. In a further aspect, the sense amplifier includes a second amplifier, wherein during the sense phase of the read operation, the first capacitive element is coupled between the first bit line and an input of the second sense amplifier, wherein the second amplifier is configured to, during the sense phase of the read operation, provide the first sense amplifier output.

In yet another embodiment, a method of performing a read operation of a selected bit cell, wherein the read operation has a calibration phase and a subsequent sense phase, includes during the calibration phase, storing a first voltage representative of a leakage current on a selected source line coupled to the selected bit cell; and during a sense phase: coupling the stored first voltage to a selected bit line coupled to the selected memory cell, providing a read current to the selected bit line, and while coupling the stored first voltage to the selected bit line and providing the read current to the selected bit line, providing a first sense amplifier output indicative of a logic state of the selected memory cell. In one aspect, during the calibration phase, the method further includes coupling a first terminal of a first capacitor to the selected source line; sampling a voltage on the selected bit line; and using a first amplifier having a non-inverting input coupled to the first terminal of the first capacitor and having an output coupled to an inverting input of the first amplifier to generate the first voltage at the output of the first amplifier; and transferring the first voltage to a second capacitor having a first terminal coupled to the output of the first amplifier. In a further aspect, the method, during the calibration phase, further includes decoupling the first terminal of the first capacitor from the selected source line prior to the using the first amplifier to generate the first voltage. In another aspect, the method, during the calibration phase, further includes limiting the leakage current on the selected source line to a predetermined reference current. In another aspect, the method, during the sense phase, further includes coupling the first terminal of the second capacitor to the selected bit line; and using a second amplifier having a non-inverting input coupled to a second terminal of the second capacitor and an output coupled to the non-inverting input to provide the first sense amplifier output. In a further aspect, the method, during the calibration phase, further includes decoupling the output of the second amplifier from the non-inverting input of the second amplifier.

What is claimed is:

1. An integrated circuit, comprising:
    an array of resistive non-volatile memory cells comprising a plurality of word lines, a plurality of bit lines, and a plurality of source lines, wherein:
        each non-volatile memory cell is coupled to a corresponding word line, a corresponding bit line, and a corresponding source line, and
        each source line corresponds to one bit line and is shared by all memory cells of a memory column coupled to the corresponding one bit line;
    a sense amplifier coupled to a first bit line of the plurality of bit lines and a corresponding first source line of the plurality of source lines, wherein, when a memory cell coupled to the first bit line is selected for a read operation, the sense amplifier is configured to:
        during a calibration phase of the read operation of the memory cell, store a first voltage representative of a leakage current on the first source line, and
        during a sense phase of the read operation, apply the stored first voltage to the first bit line and provide a first sense amplifier output indicative of a logic state of the selected memory cell.

2. The integrated circuit of claim 1, wherein the sense amplifier is configured to, during the sense phase of the read operation, apply a read current to a first end of the first bit line in which a second end of the first bit line, opposite the first end, is coupled to the stored first voltage.

3. The integrated circuit of claim 1, wherein the sense amplifier comprises a first amplifier coupled to the first source line and configured to, during the calibration phase of the read operation, generate the first voltage and transfer the first voltage to a first capacitive element.

4. The integrated circuit of claim 3, wherein the sense amplifier comprises a second amplifier, wherein during the sense phase of the read operation, the first capacitive element is coupled between the first bit line and an input of the second sense amplifier, wherein the second amplifier is configured to, during the sense phase of the read operation, provide the first sense amplifier output.

5. A method of performing a read operation of a selected bit cell, wherein the read operation has a calibration phase and a subsequent sense phase, the method comprising:
    during the calibration phase, storing a first voltage representative of a leakage current on a selected source line coupled to the selected bit cell; and
    during a sense phase:
        coupling the stored first voltage to a selected bit line coupled to the selected memory cell,
        providing a read current to the selected bit line, and
        while coupling the stored first voltage to the selected bit line and providing the read current to the selected bit line, providing a first sense amplifier output indicative of a logic state of the selected memory cell.

6. The method of claim 5, wherein the method, during the calibration phase, further comprises:
    coupling a first terminal of a first capacitor to the selected source line;
    sampling a voltage on the selected bit line; and
    using a first amplifier having a non-inverting input coupled to the first terminal of the first capacitor and having an output coupled to an inverting input of the first amplifier to generate the first voltage at the output of the first amplifier; and
    transferring the first voltage to a second capacitor having a first terminal coupled to the output of the first amplifier.

7. The method of claim 6, wherein the method, during the calibration phase, further comprises:
    decoupling the first terminal of the first capacitor from the selected source line prior to the using the first amplifier to generate the first voltage.

8. The method of claim 6, wherein the method, during the calibration phase, further comprises:
    limiting the leakage current on the selected source line to a predetermined reference current.

9. The method of claim 6, wherein the method, during the sense phase, further comprises:
    coupling the first terminal of the second capacitor to the selected bit line; and
    using a second amplifier having a non-inverting input coupled to a second terminal of the second capacitor and an output coupled to the non-inverting input to provide the first sense amplifier output.

10. The method of claim 9, wherein the method, during the calibration phase, further comprises:
    decoupling the output of the second amplifier from the non-inverting input of the second amplifier.

11. The integrated circuit of claim 1, wherein the sense amplifier includes:

a first capacitor, a first switch configured to couple the first bit line to a first terminal of the first capacitor in a first position and configured to decouple the first bit line from the first terminal of the first capacitor in a second position, a first amplifier having a non-inverting input coupled to the first terminal of the first capacitor and an inverting input coupled to an output of the first amplifier, a second switch configured to decouple the output of the first amplifier from the first bit line in a first position and to couple the output of the first amplifier to the first bit line in a second position, a second capacitor;

a third switch configured to couple the output of the first amplifier to a first terminal of the second capacitor in a first position and to couple the first bit line to the first terminal of the second capacitor in a second position;

a second amplifier having an inverting input coupled to a second terminal of the second capacitor; and a fourth switch configured to couple an output of the second amplifier to the inverting input of the second amplifier in a first position and to decouple the output of the second amplifier from the inverting input of the second amplifier in a second position.

12. The integrated circuit of claim 11, wherein, during the calibration phase of the read operation of a non-volatile memory cell coupled to the first bit line, the first, second, third, and fourth switches are in their respective first position.

13. The integrated circuit of claim 12, wherein, during the calibration phase of the read operation, the first switch is changed to its second position, while the first, third, and fourth switches remain in their respective first positions.

14. The integrated circuit of claim 13, wherein, after completion of the calibration phase, the second capacitor stores the first voltage representative of the leakage current on the first source line.

15. The integrated circuit of claim 14, wherein, during the sense phase of the read operation, subsequent to completion of the calibration phase, the second, third, and fourth switches are changed to their respective second positions and the output of the second amplifier provides a first output of the sense amplifier.

16. The integrated circuit of claim 15, wherein during the sense phase, the stored first voltage representative of the leakage current on the first source line is applied to a first end of the first bit line closest to the sense amplifier while a read current is applied to a second end of the first bit line, opposite the first end.

17. The integrated circuit of claim 1, further comprising a column decoder coupled between the array and the sense amplifier and configured to select the first bit line from a first subset of bit lines of the plurality of bit lines.

18. The integrated circuit of claim 17, further comprising a plurality of sense amplifiers coupled to the column decoder, wherein the column decoder is configured to select a selected bit line from a corresponding subset of bit lines from the plurality of bit lines and couple the selected bit line to a corresponding sense amplifier.

19. The integrated circuit of claim 1, further comprising a current mirror coupled to the first source line, wherein the current mirror is configured to, during the calibration phase, limit the leakage current on the first source line to a predetermined reference current.

20. The integrated circuit of claim 11, wherein the sense amplifier further comprises a fifth switch configured to couple a first reference to the non-inverting input of the second amplifier in a first position and a second reference to the non-inverting input of the second amplifier in a second position.

* * * * *